United States Patent
Brinker et al.

(10) Patent No.: US 6,762,605 B2
(45) Date of Patent: *Jul. 13, 2004

(54) MAGNETIC RESONANCE IMAGING METHOD AND APPARATUS WITH ADHERENCE TO SAR LIMITS IN A SCAN USING DATA FROM A PREVIOUS SCAN

(75) Inventors: Gerhard Brinker, Erlangen (DE); Richard Koellner, Weisendorf (DE); Klaus Ludwig, Nürnberg (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 10/281,797

(22) Filed: Oct. 28, 2002

(65) Prior Publication Data

US 2003/0080738 A1 May 1, 2003

(30) Foreign Application Priority Data

Oct. 29, 2001 (DE) .......................................... 101 53 320

(51) Int. Cl.[7] .................................................. G01V 3/00
(52) U.S. Cl. ...................................... 324/309; 324/307
(58) Field of Search ................................ 324/300, 307, 324/309, 318, 322, 314, 312

(56) References Cited

U.S. PATENT DOCUMENTS

| | | | |
|---|---|---|---|
| 5,144,238 A | | 9/1992 | Ehnholm |
| 5,492,122 A | * | 2/1996 | Button et al. ................ 600/411 |
| 6,034,528 A | * | 3/2000 | Heid ............................ 324/309 |
| 6,426,623 B1 | * | 7/2002 | Bernstein ..................... 324/314 |
| 2003/0098687 A1 | * | 5/2003 | Arneth et al. ................ 324/309 |
| 2003/0098688 A1 | * | 5/2003 | Brinker et al. ............... 324/309 |

FOREIGN PATENT DOCUMENTS

| | | | |
|---|---|---|---|
| JP | 3-284241 | * | 12/1991 |
| JP | 05-317287 | * | 12/1993 |
| JP | 07-222725 | * | 8/1995 |
| JP | 08-038447 | * | 2/1996 |
| JP | 11-253416 | * | 9/1999 |

OTHER PUBLICATIONS

Dina Simunic et al., "Spatial Distribution of High–Frequency Electromagnetic Energy in Human Head During MRI: Numerical Resuls and Measurements", IEEE, vol. 43, No. 1 Jan. 1996, pp. 88–94.*

Ji Chen et al., "Numerical Simulation of SAR and B1–Field Inhomogeneity of Shield RF Coils Loaded with the Human Head", IEEE, vol. 45, No. 5, May 1998, pp. 650–659.*

* cited by examiner

*Primary Examiner*—Diego Gutierrez
*Assistant Examiner*—Dixomara Vargas
(74) *Attorney, Agent, or Firm*—Schiff Hardin LLP

(57) ABSTRACT

In a method and apparatus for magnetic resonance imaging with adherence to SAR limits, a patient is exposed to a radio-frequency pulse sequence via at least one transmission antenna for the implementation of a measurement and the magnetic resonance signals that are generated are acquired in a spatially resolved manner via at least one reception antenna and are further-processed for generating magnetic resonance images or spectra, with current SAR values for planned parameters of the measurement being identified before the implementation of the measurement and the parameters being modified as needed until the current SAR values lie within the SAR limits. The determination of the current SAR values ensues employing stored data that contain the time curve of the RF stressing of the patient during one or more preceding measurements, as well as information from which the temporal spacing of the RF stress of the preceding measurements from the planned measurement can be determined. Better utilization of the performance capability of the magnetic resonance tomography apparatus is achieved by the patient throughput, which is of particular interest for economic feasibility, being increased with adherence to the SAR limit values.

12 Claims, 3 Drawing Sheets

MAGNETIC RESONANCE IMAGING METHOD AND APPARATUS WITH ADHERENCE TO SAR LIMITS IN A SCAN USING DATA FROM A PREVIOUS SCAN

BACKGROUND OF THE INVENTION

1. Field of the Invention

The present invention is directed to a method for magnetic resonance imaging with adherence to SAR limits, wherein a patient is exposed to a radio-frequency pulse sequence via at least one transmission antenna for the implementation of a measurement in a magnetic resonance tomography apparatus and the magnetic resonance signals that are generated are acquired in a spatially resolved manner via at least one reception antenna and are further-processed for generating magnetic resonance images or spectra, and wherein current SAR values for planned parameters of the measurement are identified before the implementation of the measurement and the parameters are modified as needed until the current SAR values lie within the SAR limits. The invention also is directed to a magnetic resonance installation for the implementation of such a method.

2. Description of the Prior Art

Magnetic resonance tomography is a known technique for acquiring images of the inside of the body of an examination subject. For implementation of magnetic resonance tomography, a basic field magnet generates a static, relatively homogeneous basic magnetic field. Rapidly switched gradient fields for location coding that are generated by gradient coils, are superimposed on this basic magnetic field during the data acquisition for exposure of magnetic resonance images. Sequences of radio-frequency pulses for triggering magnetic resonance signals are emitted into the examination subject with one or more radio-frequency transmission antennas. The magnetic resonance signals occasioned by these radio-frequency pulses are produced by radio-frequency reception antennas. Tomograms of the inside of the body of the patient are calculated and displayed on the basis of the magnetic resonance signals received from the field of view (FoV) under observation, which may cover one or more body slices of the patient. All body regions from the head to the foot can be measured in this way by displacement of the patient bed within the magnetic resonance tomography apparatus.

A critical demand in modern magnetic resonance tomography is the capability for fast imaging. This demand results from economic considerations of being able to examine as many patients as possible per time interval and due to specific medical inquiries wherein a fast imaging is required for the examination result. One example of this is the reduction of motion artifacts due to movement of the patient during the measurement.

The high repetition rate of the radio-frequency transmission pulses or transmission pulse sequences required for a fast imaging, however, leads to a higher stress on the patient with electromagnetic radiation. Due to legal regulations, limit values are prescribed for this SAR (Specific Absorption Rate) stress that cannot be exceeded in magnetic resonance imaging. Since modern magnetic resonance tomography systems are technically capable of stressing patients with significantly higher SAR values than are legally permitted, SAR monitors are utilized in order to assure adherence to the limit values in the measurement. In addition to whole-body SAR values, specific limit values also must be adhered to for various body regions, for which a fundamental distinction must be made between whole body exposures, partial body exposures and local exposures.

German OS 40 42 212 discloses a method for magnetic resonance imaging wherein the primary magnetic field is cyclically switched between two field strengths in the implementation of a measurement in order adhere to the SAR limits and in order to utilize the latitude prescribed by the limit values as fully as possible. Detailed description relating to the determination of the SAR values are not provided in this publication.

The SAR stress is dependent on the individual patient data as well as on the position of the patient relative to the transmission antenna, on the type of transmission antenna, and the measurement parameters such as the transmission power, the repetition rate, the type of pulse sequence, the number of slices to be measures, and the position of the slices in the patient's body. The parameters of the measurement usually are combined in a measurement protocol.

In order to prevent an upward transgression of the legally prescribed SAR limit values during the measurement, the SAR monitor measures the RF energy actually emitted by the system in order, if necessary, to shut off the RF system given an upward transgression of the legally allowed, accumulated RF energy within a predefined time interval. Additionally, a prediction (estimation) wherein the SAR values for the planned parameters of the measurement are determined, is implemented before every measurement. As a result of this prediction, the possibility of an upward transgression of the SAR limit values for the planned measurement is already recognized in advance, so that the measurement protocol can be varied as needed in order to adhere to the limit values. A prediction is based on determining that total energy at every point in time of the measurement time of a measurement protocol that respectively accumulates within the legally prescribed time interval for the respective SAR limit. This total energy in each time interval must not exceed the legally prescribed upper limit, the respective SAR limit value. Some of the legally prescribed limits are based on an averaging of the RF energy beamed in over a time span of a few minutes, for example 5 or 15 minutes.

In the conventional predictions that have hitherto been implemented, the parameters for the planned measurement, i.e. the measurement protocol, are employed in addition to the patient data for the determination of the current SAR values. Magnetic resonance measurements, however, often are shorter than the averaging times on which the SAR limits are based. Since a number of independent measurements are implemented on the patient in many instances, a maximum RF exposure conventionally has been assumed for safety reasons in the calculation of the current SAR values for the planned measurement, for a time interval before the beginning of the measurement that still lies within the averaging time for the particular SAR limit value. Even given, for example, very short, one-time measurements at the patient, however, this conservative prediction leads the actually permitted energy absorption being reduced by the quotient "run time of the protocol/prescribed averaging time span".

SUMMARY OF THE INVENTION

An object of the present invention is to provide a method as well as an apparatus for magnetic resonance imaging upon adherence to SAR limits that enable a better utilization of the performance of the magnetic resonance tomography apparatus in the imaging.

This object is achieved in a method and system of the type initially described wherein, according to the invention, the determination of the current SAR values for a planned measurement ensues using stored data that contain the time curve of the RF stressing of the patient during one or more preceding measurements as well as information from which the temporal spacing of the RF stress of the preceding measurements from the planned measurement can be determined. In the inventive method, thus, the actual RF stress of the patient in the past is taken into consideration for determining the averaging time required for the calculation of the SAR values insofar as preceding measurements still lie within this averaging time. A pre-condition for this is that suitable data are registered and stored in every measurement. Such data must contain the time curve of the RF stress on the patient as well as allowing a determination of the temporal spacing of the RF stress at an arbitrary point in time of the preceding measurements from an arbitrary point in time of the planned measurement. This can ensue by storing absolute time information with reference to the measured RF stresses or, for example, by the RF stress also being registered at defined, small time intervals in the pauses between individual, independent measurements, so that conclusions about the temporal spacing can be made from the measured data.

The appertaining magnetic resonance system must include a unit that records the RF power received in the patient during the measurement in terms of a time curve. Instead of the received power, the transmission power and the respective absorption—the quotient of the power absorbed by the patient relative to the total transmission power—can be logged separately from one another. This quotient varies with changes in the positioning of the patient relative to the transmission coil. Further, the unit for calculating the current SAR values must be configured such that it involves the stored data in the determination of these values.

In addition to containing the pure, planned measurement sequence, the prediction in the inventive method also contains the history immediately before the measurement. The previous performance history is taken into consideration in the prediction. The total averaging interval on which the corresponding SAR limit value is based is extended into the past for every arbitrary point in time of the planned measurement. This consideration is in turn implemented for every point in time of the measurement itself. Past and future therefore are no longer separated for a prediction but are united to form a continuous performance view.

An advantage of the inventive method is that the occurrence of a maximum exposure in the past no longer need be assumed for the determination of the current SAR values; rather, the actual RF stress that the patient was subjected to in the averaging time lying in the past is taken into consideration. In the case of a lower stress in the past, thus, a comparatively higher power can be emitted into the patient in the planned measurement without exceeding the allowed SAR limit values.

DESCRIPTION OF THE PREFERRED EMBODIMENTS

Figure 1:
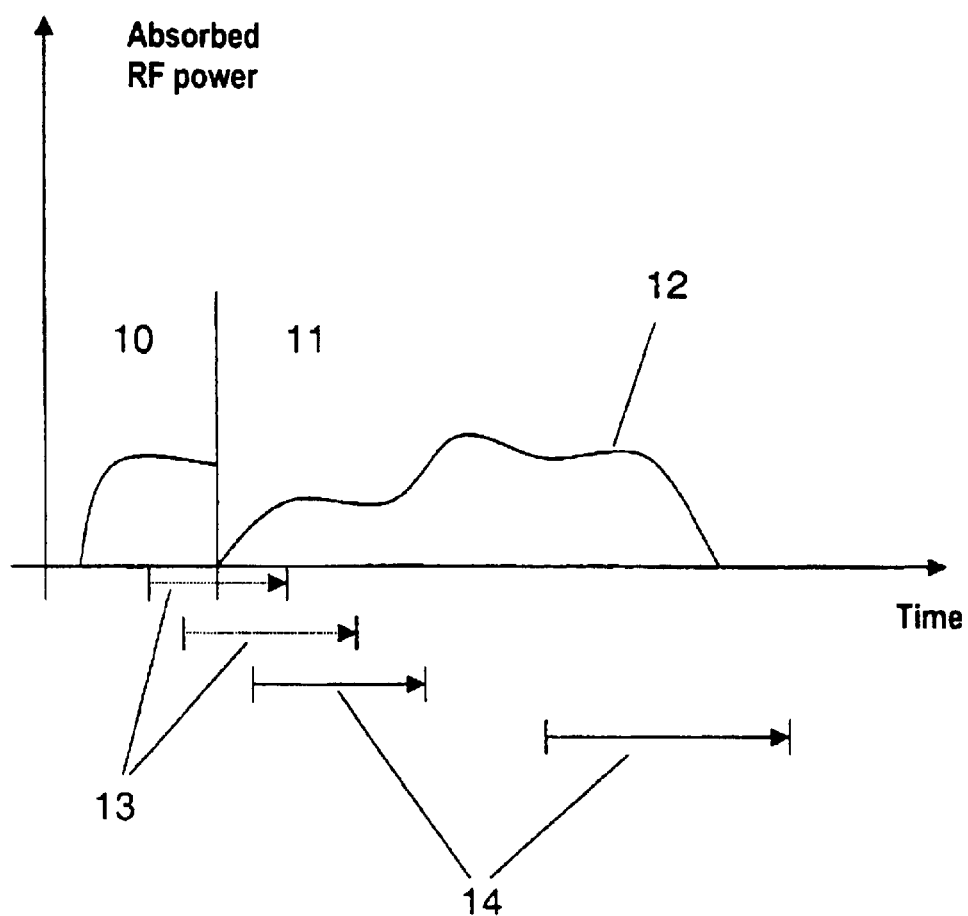
FIG. 1 schematically illustrates the RF stress of a patient dependent on time in independent measurements.

FIG. 1 schematically shows an RF power absorbed by a patient entered over time for two successive, independent measurements that respectively lie in the past 10 and in the future 11. The vertical line designates the current point in time at which the current SAR values are to be determined for a planned measurement. The power curve 12 of the planned measurement is entered in the future 11. Various time intervals over which the RF power must be averaged in the calculation of the current SAR values are shown under the time axis in FIG. 1. In order to assure for all points in time of the planned measurement that the SAR limits are not exceeded, the time window illustrated by the arrows 13, 14 before the beginning of the measurement must be shifted, coming from the past into the future and up to the end of the planned measurement. The shift must occur in adequately small time steps so that an possible upward transgression of the SAR limit during the measurement is correctly recognized. The time intervals (broken-line arrows) or time windows referenced 13 in FIG. 1 illustrate the situation wherein the past still partly enters into the SAR value determination. The time intervals 14 (solid-line arrows) lie completely in the future. The summed total energies of the two time intervals at the right can be determined very simply in the prediction by integrating the power, that can be derived from the parameters of the measurement protocol, over the respective time interval. For determining the total energy in the two intervals at the left, however, information about the power absorbed in the past must be available. This is not the case in the conventional methods known in the art, so that it has assumed for safety reasons that the power in the past was as high as the maximally allowed average power in such a time interval.

When it is the case that the patient was not yet exposed to the allowed maximum energy—over the legal time averaging interval—due to applied RF energy, then a higher dose can be applied with a following measurement without exceeding the average maximum power allowed in the prescribed time interval. This improved utilization of the performance of the magnetic resonance system is possible given application of the inventive method because the power information of the past for the patient is available in the form of stored data and can be interpreted.

Figure 2:
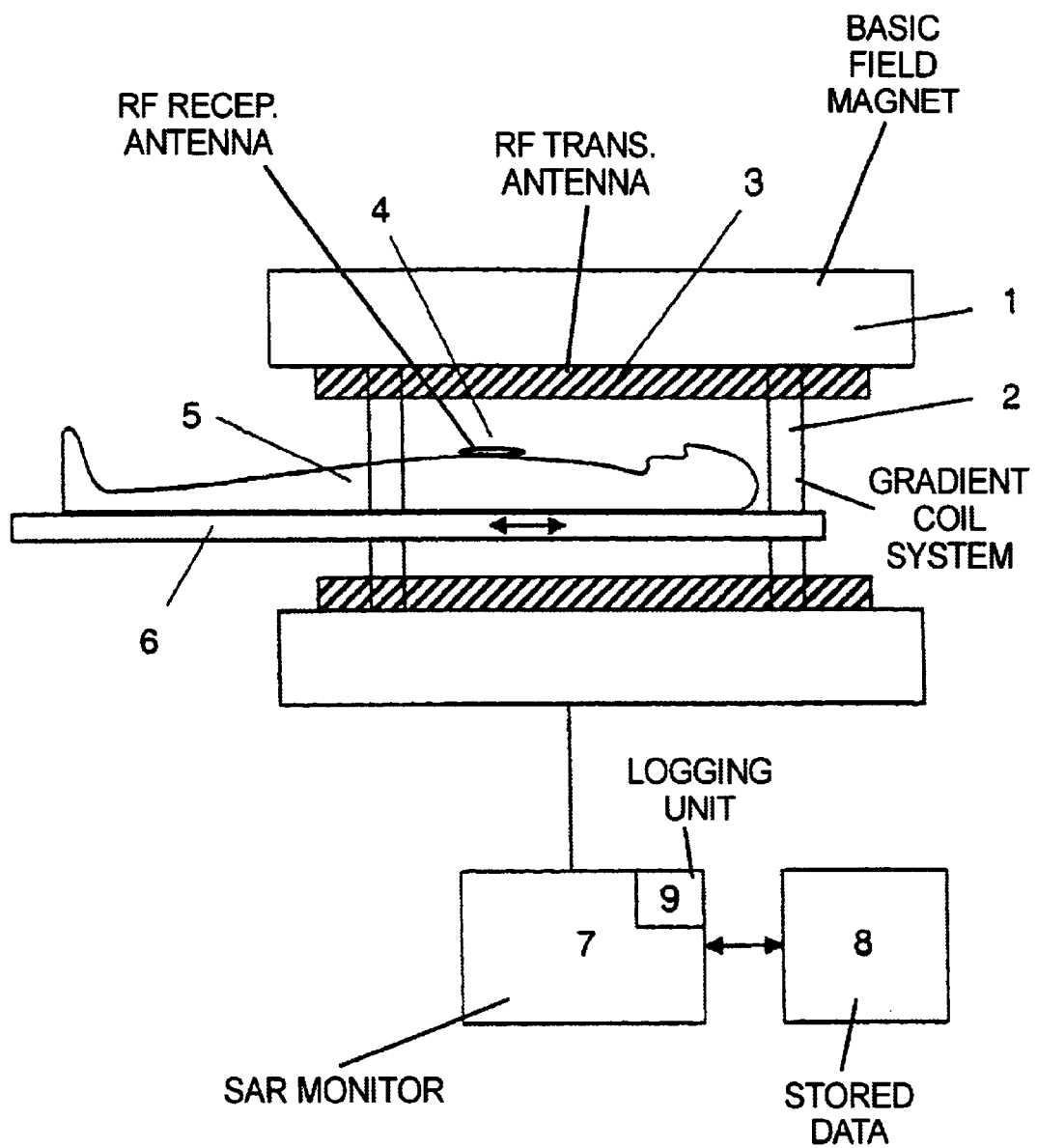
FIG. 2 is an example of the basic component of a magnetic resonance tomography apparatus constructed and operating in accordance with the invention.

FIG. 2 schematically shows a section through a magnetic resonance tomography apparatus with which the inventive method can be implemented. FIG. 2 shows only the basic components of the apparatus, namely a basic field magnet 1, a gradient coil system 2, a radio-frequency transmission antenna 3 as well as a reception coil 4. This can be a pure reception coil optimized for the specific diagnostic inquiry or a local transmission/reception coil as is often utilized, for example, in spectroscopic applications. Further, a patient 5 is shown on a patient bed 6 that is movable within the magnetic resonance tomography apparatus in the directions indicated by-the arrow. In the measurement, radio-frequency pulses for generating magnetic resonance signals in the body of the patient are emitted via the radio-frequency transmission antenna 3 fashioned as a whole-body coil. The resulting magnetic resonance signals are acquired with the reception coil 4 or with the radio-frequency antenna, that can also be operated as receiver, and are presented in the form of a two-dimensional magnetic resonance image of the covered measurement region. For acquiring body regions lying outside the measurement region, the patient 5 is moved with the patient bed 6 step-by-step by a specific distance in the indicated direction.

FIG. 2 also shows a unit 7 for calculating the SAR values, referred to as an SAR monitor. This unit has access to stored data 8 that contain the time curve of an RF stress on the patient during one or more preceding measurements as well as information from which the temporal spacing of the preceding RF stress from the planned measurement can be determined. This stored time curve corresponds to a dataset as shown, for example, in FIG. 1 in the past 10.

In the present case, the time of day of the beginning and end of the prior measurement is likewise stored, so that the RF stress at any point in time as well as the temporal spacing from the planned measurement can be determined.

These data 8, together with the time of day of the beginning and end of the measurement, are stored by a logging unit 9 during the measurement. The logging unit 9 stores the actually applied RF power in fixed, short time intervals, so that a specific plurality of stored measured values corresponds to a specific time interval.

Figure 3:
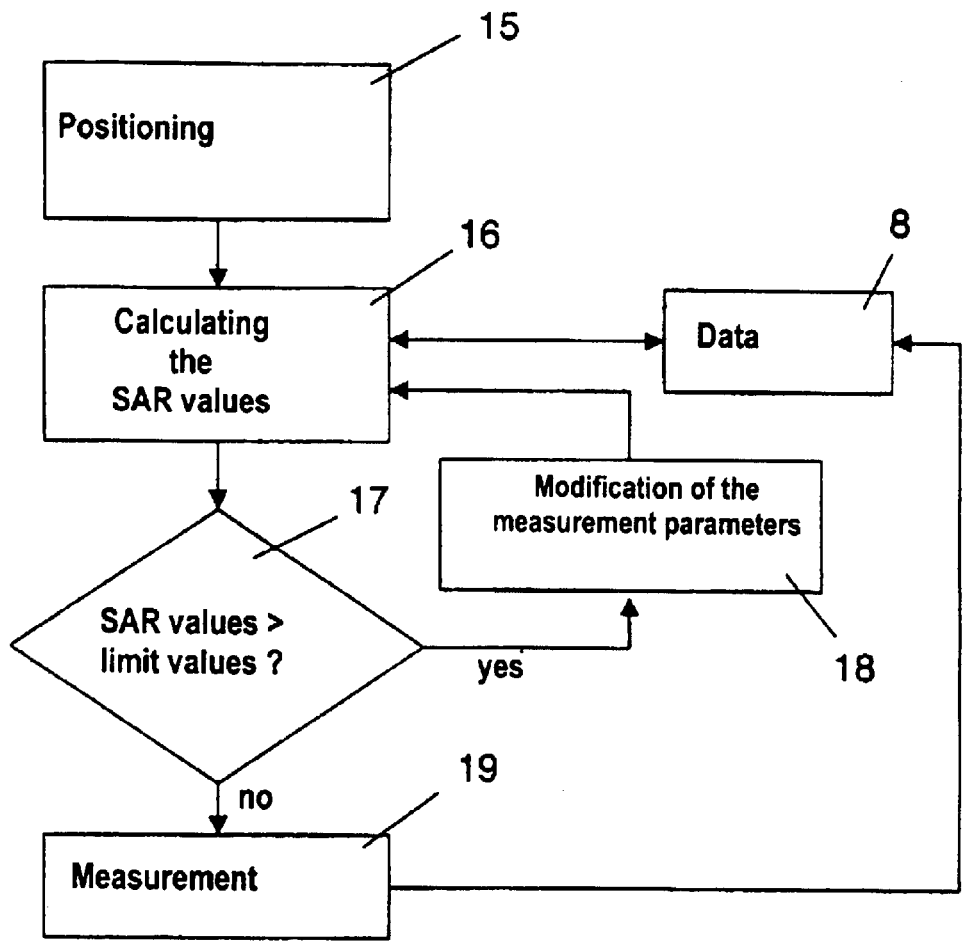
FIG. 3 is a flowchart for the implementation of the inventive method according to an exemplary embodiment.

In an exemplary embodiment, FIG. 3 shows a flowchart for the implementation of the present method. The patient 5 is first positioned (step 15) on the patient bed 6 according to the intended measurement. Subsequently, the current SAR values for the planned measurement protocol are determined in step 16. Stored data 8 are also involved, that represent information about the time curve of the RF stress on the patient in one or more preceding measurements as well as an information from which the temporal spacing of the preceding measurements from the planned measurement can be determined. The SAR values are determined in step 16 taking the RF stress of the patient in the past into consideration, insofar as this stress still lies in the averaging time interval for the respective SAR value.

After this determination of the current SAR values for the planned measurement parameters, a comparison to the SAR limit values is implemented in order, given an upward transgression of the limit values, to be able modify the parameters to adhere to the limit values (steps 17, 18). When the planned measurement parameters adhere to the SAR limit values, then the actual measurement 19 can ensue. In this measurement, the time curve of the RF stress together with an absolute time information are again saved in a memory area 8.

A modification of the parameters can ensue either automatically or can be implemented by the user on the basis of a software dialogue. Since there are usually several meaningful possibilities for modifying these parameters, these are usually displayed to the user for selection, preferably on the basis of software dialogue.

In the present method, thus, the RF power absorbed by a patient is logged over time, so that a performance history arises. This performance history is composed of values of actually absorbed RF power over time. In the case of a prediction, this history is expanded into the future with calculated power values over time. The total energies of all time intervals thus also can be calculated when these lie entirely or even only partly in the past or in the future. The energetic pre-history of a measurement need no longer be assumed to have included a maximum stress. On the contrary, the actual power curve can be utilized for the calculation.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic resonance imaging comprising the steps of:
    planning a current magnetic resonance measurement, having planned parameters associated therewith, for obtaining magnetic resonance data from a subject by exposing the subject to a radio-frequency pulse sequence in which said examination subject will experience RF stressing;
    storing data representing a time curve of a history of RF stressing experienced by the subject during at least one preceding magnetic resonance measurement, conducted and completed before said current magnetic resonance measurement, including data representing a temporal spacing of RF stressing in said at least one preceding magnetic resonance measurement from RF stressing in said planned current magnetic resonance measurement;
    calculating a current specific absorption rate (SAR) value for said current magnetic resonance measurement using said stored data and modifying said planned parameters as needed to bring said current SAR value within a predetermined SAR limit; and
    conducting said current magnetic resonance measurement using the planned parameters that have been modified as needed.

2. A method as claimed in claim 1 comprising augmenting said data by identifying and storing RF stressing of said subject during said current magnetic resonance measurement with respect to time.

3. A method as claimed in claim 1 wherein the step of storing data comprises storing data for said at least one preceding magnetic resonance measurement conducted with constant RF power, representing a starting time of said at least one preceding magnetic resonance measurement, and ending time of said at least one preceding magnetic resonance measurement, and a duration of RF stressing in said at least one preceding magnetic resonance measurement.

4. A method as claimed in claim 1 wherein said planned parameters include a repetition rate of said sequence, a flip angle of radio-frequency pulses in said sequence, a plurality of slices from which data are obtained in said current magnetic resonance measurement, and a slice thickness of a slice from which data are obtained in said current magnetic resonance measurement, and wherein the step of modifying said planned parameters as needed comprises modifying at least one of said repetition rate, said flip angle, said plurality of slices and said slice thickness.

5. A method as claimed in claim 1 wherein the step of modifying said planned parameters as needed comprises introducing pauses in said current magnetic resonance measurement until said current SAR value is within said predetermined SAR limit value.

6. A method as claimed in claim 1 wherein said current magnetic resonance measurement has a measurement time associated therewith, and wherein the step of modifying said planned parameters as needed comprises lengthening said measurement time until said current SAR value is within said predetermined SAR limit value.

7. A magnetic resonance apparatus comprising:
    a magnetic resonance examination unit for conducting a current magnetic resonance measurement, having planned parameters associated therewith, to obtain magnetic resonance data from a subject by exposing the subject to a radio-frequency pulse sequence in said examination unit in which said examination subject will experience RF stressing;
    a memory for storing data representing a time curve of a history of RF stressing experienced by the subject during at least one preceding magnetic resonance measurement, conducted and completed before said current magnetic resonance measurement, including data representing a temporal spacing of RF stressing in said at least one preceding magnetic resonance measurement from RE stressing in said current magnetic resonance measurement; and a specific absorption rate (SAR) monitor for calculating a current specific absorption rate value for said current magnetic resonance measurement using said stored data and for modifying said planned parameters as needed, before conducting said current magnetic resonance measurement to bring said current SAR value within a predetermined SAR limit.

8. A magnetic resonance apparatus as claimed in claim 7 wherein said SAR monitor identifies and stores, in said memory, RF stressing of said subject during said current magnetic resonance measurement with respect to time.

9. A magnetic resonance apparatus as claimed in claim 7 wherein said SAR monitor stores data in said memory for said at least one preceding magnetic resonance measurement conducted with constant RF power, representing a starting time of said at least one preceding magnetic resonance measurement, and ending time of said at least one preceding magnetic resonance measurement, and a duration of RF stressing in said at least one preceding magnetic resonance measurement.

10. A magnetic resonance apparatus as claimed in claim 7 wherein said planned parameters include a repetition rate of said sequence, a flip angle of radio-frequency pulses in said sequence, a plurality of slices from which data are obtained in said current magnetic resonance measurement, and a slice thickness of a slice from which data are obtained in said current magnetic resonance measurement, and wherein said SAR monitor modifies said planned parameters as needed by modifying at least one of said repetition rate, said flip angle, said plurality of slices and said slice thickness.

11. A magnetic resonance apparatus as claimed in claim 7 wherein said SAR monitor modifies said planned parameters as needed by introducing pauses in said current magnetic resonance measurement until said current SAR value is within said predetermined SAR limit value.

12. A magnetic resonance apparatus as claimed in claim 7 wherein said current magnetic resonance measurement has a measurement time associated therewith, and wherein said SAR monitor modifies said planned parameters as needed by lengthening said measurement time until said current SAR value is within said predetermined SAR limit value.

* * * * *